(12) United States Patent
Lin et al.

(10) Patent No.: US 9,190,808 B1
(45) Date of Patent: Nov. 17, 2015

(54) ACTIVE OPTICAL ASSEMBLY HAVING HEAT SINK STRUCTURE

(71) Applicants: Yuan-Chieh Lin, Lake Forest, CA (US); Jun-Bin Huang, Eastvale, CA (US); Jim Zhao, Irvine, CA (US); Gang Paul Chen, Walnut, CA (US); Jie Zheng, Rowland-Heights, CA (US); Terrance F. Little, Fullerton, CA (US); An-Jen Yang, Irvine, CA (US)

(72) Inventors: Yuan-Chieh Lin, Lake Forest, CA (US); Jun-Bin Huang, Eastvale, CA (US); Jim Zhao, Irvine, CA (US); Gang Paul Chen, Walnut, CA (US); Jie Zheng, Rowland-Heights, CA (US); Terrance F. Little, Fullerton, CA (US); An-Jen Yang, Irvine, CA (US)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 14/330,186

(22) Filed: Jul. 14, 2014

(51) Int. Cl.
  *G02B 6/12* (2006.01)
  *H01S 5/024* (2006.01)
  *G02B 6/42* (2006.01)
  *H01S 5/026* (2006.01)

(52) U.S. Cl.
  CPC .............. *H01S 5/024* (2013.01); *G02B 6/4268* (2013.01); *H01S 5/0262* (2013.01)

(58) Field of Classification Search
  CPC ......... H01L 2924/00; G02B 6/43; G02B 6/12
  USPC ...................................... 385/4, 8, 14
  See application file for complete search history.

(56) References Cited

U.S. PATENT DOCUMENTS

| | | | |
|---|---|---|---|
| 6,843,606 B2 * | 1/2005 | Deane et al. ..................... | 385/92 |
| 2004/0047637 A1 * | 3/2004 | Wang et al. ................... | 398/164 |
| 2011/0206326 A1 | 8/2011 | Avago | |
| 2012/0002284 A1 | 1/2012 | Avago | |

* cited by examiner

*Primary Examiner* — Jennifer Doan
(74) *Attorney, Agent, or Firm* — Ming Chieh Chang; Wei Te Chung

(57) ABSTRACT

An active optical assembly includes a paddle card, an optical-electrical module including an opto-electronic communication device electrically connected with the paddle card, a heat sink ring mounted to the paddle card, an optical cable subassembly inserted into the heat sink ring and optically coupling with the optical-electrical module, and a heat sink cover mounted to the heat sink ring. The heat sink cover, the heat sink ring, and the paddle card cooperate to enclose the optical-electrical module so as to transfer heat generated by the opto-electronic communication device to the heat sink ring and the heat sink cover for dissipation.

16 Claims, 5 Drawing Sheets

ACTIVE OPTICAL ASSEMBLY HAVING HEAT SINK STRUCTURE

BACKGROUND OF THE INVENTION

1. Field of the Invention

The present invention relates to an active optical assembly, and more particularly to a heat sink structure that prevents heat generated by laser diode driver and receiver ICs from adversely affecting the performance of laser diodes and photodiodes.

2. Description of Related Arts

U.S. Patent Application Publication No. 2011/0206326, published on Aug. 25, 2011, discloses an active optical assembly (e.g., a parallel optical transceiver module) comprising a paddle card or printed circuit board, a leadframe mounted on the printed circuit board, an optics holder having an optical subassembly and secured to the leadframe, and an optical-electronic module coupled between the optical subassembly and the printed circuit board. The optical-electronic module comprises a laser and a driver IC for converting electrical signal to optical signal, and a photodiode detector and a receiver IC for converting optical signal to electrical signal. The leadframe is split to provide two air gaps. One air gap is located between a laser and a driver IC, and another air gap is located between a photodiode detector and a receiver IC. These air gaps thermally isolate the photodiode detector and laser from their respective ICs, and thus help prevent heat generated by ICs from adversely affecting the performance of the laser and photodiode detector. Also disclosed is a communications system featuring a mid-plane mounting structure for mounting an array of such active optical assemblies. The communications system further comprises a heat sink device mounted on a printed circuit board of the mid-plane and operated to dissipate heat that is generated by ICs.

An improved active optical assembly is desired to offer advantages over the related art.

SUMMARY OF THE INVENTION

Accordingly, an object of the present invention is to provide an active optical assembly having a simple configuration.

In order to achieve the object set forth, an active optical assembly comprises: a paddle card; an optical-electrical module including an opto-electronic communication device electrically connected with the paddle card; a heat sink ring mounted to the paddle card; an optical cable subassembly inserted into the heat sink ring and optically coupling with the optical-electrical module; and a heat sink cover mounted to the heat sink ring, the heat sink cover, the heat sink ring, and the paddle card cooperating to enclose the optical-electrical module, for transferring heat generated from the optical-electrical module to the heat sink ring and the heat sink cover for dissipation. The optical-electrical module comprises a laser and a driver IC for converting electrical signal to optical signal, and a photodiode detector and a receiver IC for converting optical signal to electrical signal.

According to the present invention, the heat generated by ICs is dissipated through the heat sink ring and the heat sink cover. Therefore, the active optical assembly does not need to have other elements to dissipate heat.

DETAILED DESCRIPTION OF THE PREFERRED EMBODIMENT

Reference will now be made in detail to a preferred embodiment of the present invention.

Figure 1:
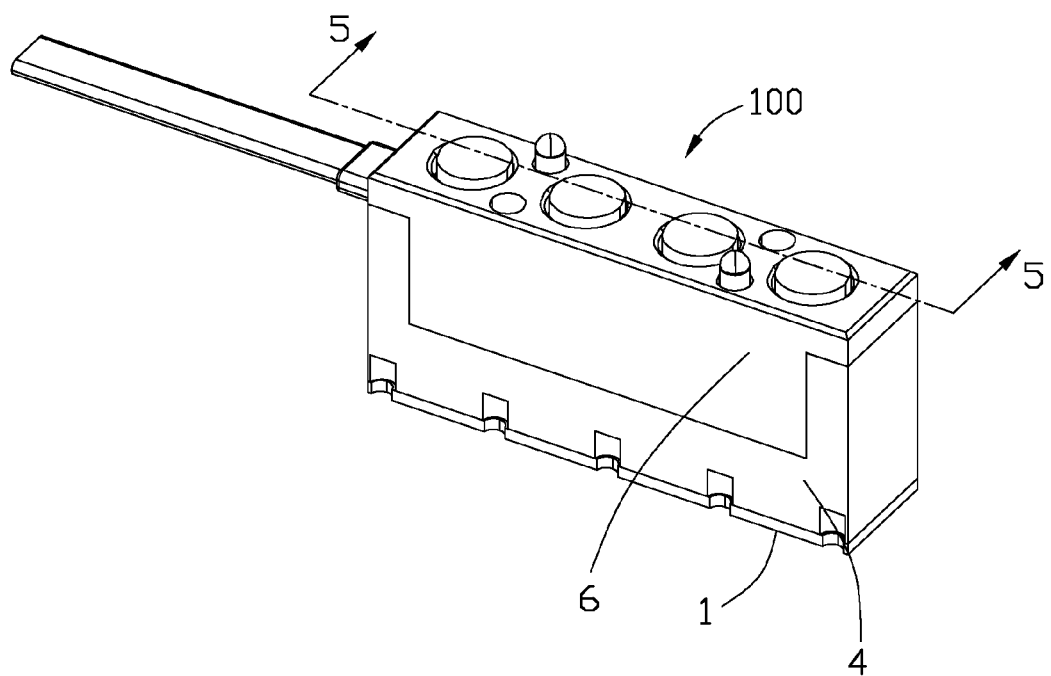
FIG. 1 is a perspective view of an active optical assembly in accordance with the present invention.
Figure 2:
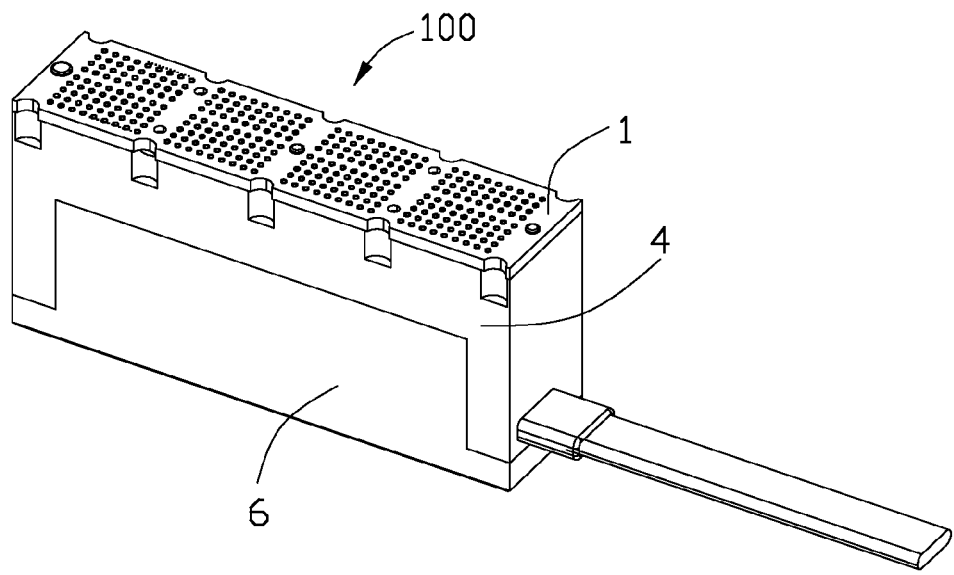
FIG. 2 is another perspective view of the active optical assembly as shown in FIG. 1.
Figure 3:
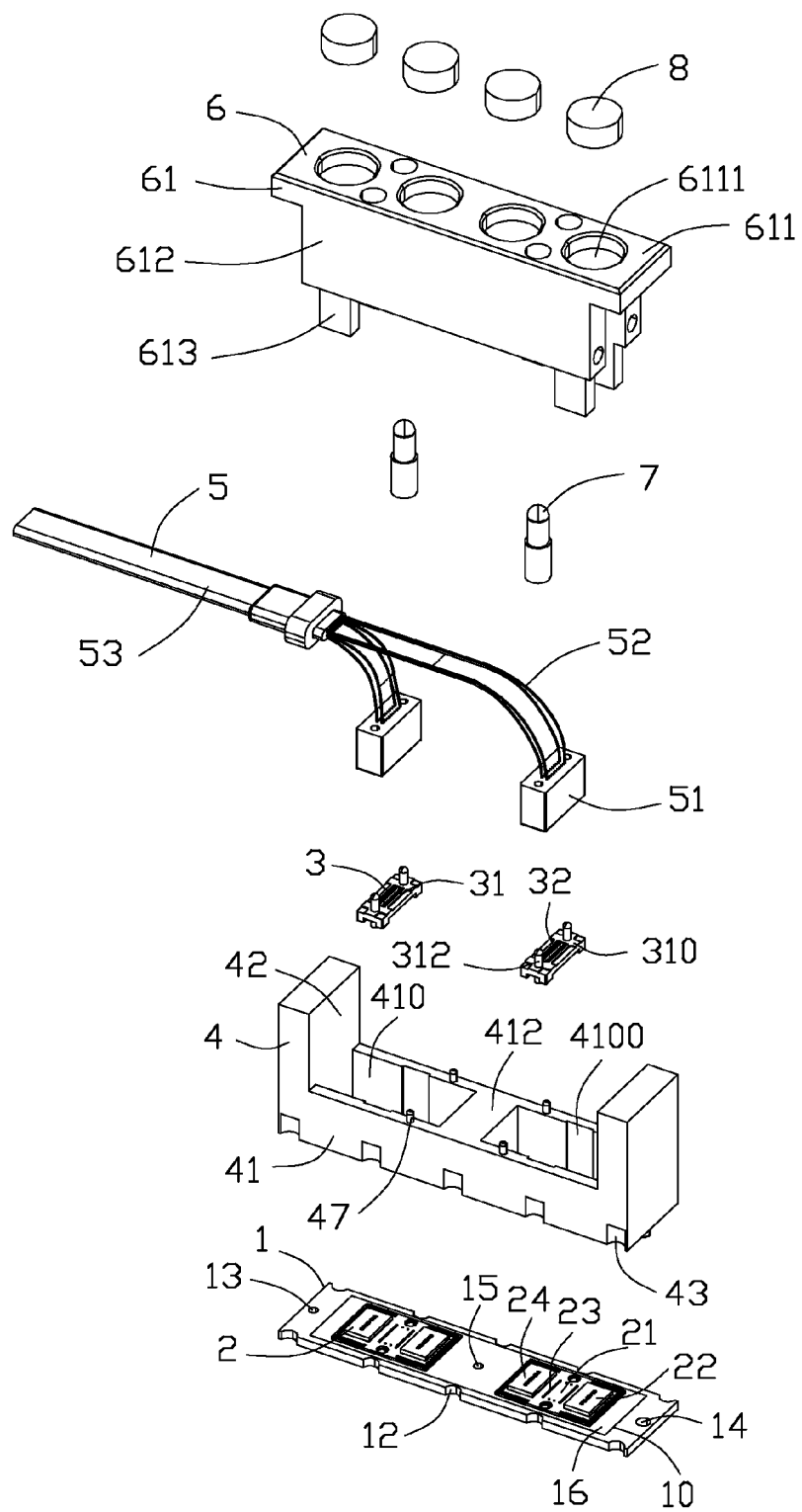
FIG. 3 is a partially exploded view of the active optical assembly as shown in FIG. 1.
Figure 4:
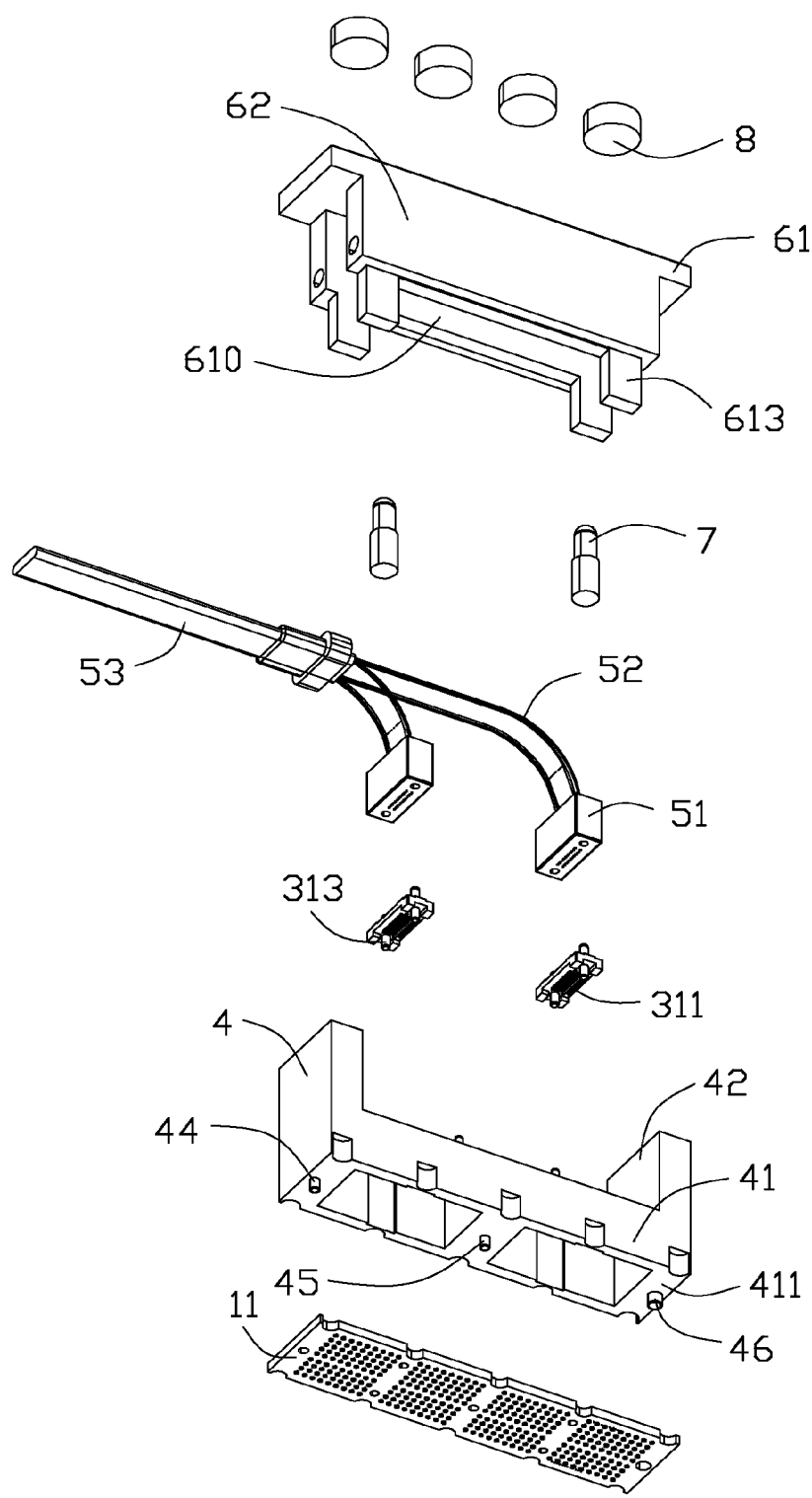
FIG. 4 is a partially exploded view of the active optical assembly as shown in FIG. 2.
Figure 5:
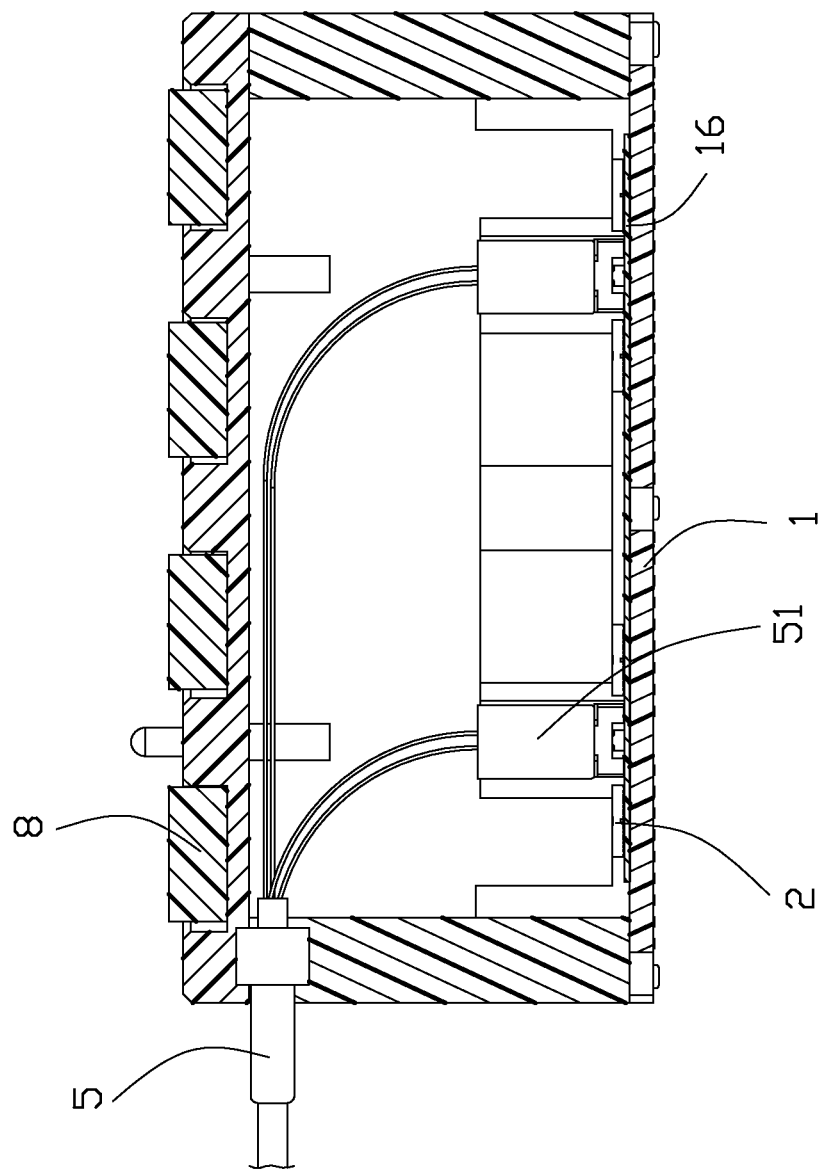
FIG. 5 is a cross-sectional view of the active optical assembly taken along line 5-5 of FIG. 1.

Referring to FIGS. 1 to 5, an active optical assembly 100 in accordance with the present invention comprises a paddle card 1, an optical-electrical module including an opto-electronic communication device 2 electrically connected with the paddle card 1 and a lens array 3 coupling with the opto-electronic communication device 2, a heat sink ring 4 mounted to the paddle card 1 to dissipate heat generated from the opto-electronic communication device 2, an optical cable subassembly 5 inserted into the heat sink ring 4 and detachable optically coupling with the lens array 3, a heat sink cover 6 mounted to the heat sink ring 4. The heat sink cover 6, the heat sink ring 4, and the paddle card 1 cooperate to enclose the optical-electrical module. Heat generated by the opto-electronic communication device 2 is transferred to the heat sink ring 4 and heat sink cover 6 to be dissipated. In this embodiment, the active optical assembly 100 comprises two opto-electronic communication devices 2 mounted on the paddle card 1 and arranged in a line. And the active optical assembly 100 comprises two lens arrays 3 coupling with corresponding opto-electronic communication devices 2. The paddle card 1, the heat sink ring 4, and the heat sink cover 6 have substantially the same length in the transverse direction, and the paddle card 1, the heat sink ring 4, and the heat sink cover 6 have substantially the same width in the longitudinal direction.

The paddle card 1 has a first surface 10, a second surface 11 opposite to the first surface 10, a plurality of inwardly-shaped corners 12 formed by removing or eliminating predetermined portions of each respective corner of the paddle card 1, a first mounting hole 13 and a second mounting hole 14 defined at opposite sides of the paddle card 2 and extending therethrough along a mating direction. The first mounting hole 13 has a diameter smaller than a diameter of the second mounting hole 14. The paddle card 1 further defines a third mounting hole 15 disposed between two opto-electronic communication devices 2 and extending from the first surface 10 of the paddle card 1 to the second surface 11 of the paddle card 1. A diameter of the third mounting hole 15 is equal to the diameter of the first mounting hole 13. The first, second, and third mounting holes 13, 14, 15 are arranged in a line. The active optical assembly 100 further comprises a ceramic substrate 16 bonded onto the paddle card 1 and coupling with the opto-electronic communication device 2.

The opto-electronic communication device 2 comprises a laser 21 and a driver IC 22 for converting electrical signal to optical signal, a photodiode detector 23 and receiver IC 24 for converting optical signal to electrical signal. The laser 21 is connected with the driver IC 22 by wirebonding. The photodiode detector 23 is connected with the receiver IC 24 by wirebonding. Each opto-electronic communication device 2 comprises 12 channels for receiving signal and 12 channels for transmitting signal. Heat generated by ICs 22, 24 are then transferred through the ceramic substrate 16 and dispersed into ambient air, finally dissipated by the heat sink cover 6. Heat generated by ICs 22, 24 are also transferred to the heat sink ring 4, and then t to the heat sink cover 6 to dissipate to ambient.

The lens array 3 includes a body portion 31 and one or more lenses 32 disposed on the body portion 31 for transmitting the optical signal. The body portion 31 includes an upper surface 310, a low surface 311, a pair of first protrusions 312 extending upwardly from the upper surface 310, and a pair of second protrusions 313 extending downwardly from the low surface 311.

The heat sink ring 4 comprises a base portion 41, a pair of beam portions 42 extending upwardly from opposite ends of the base portion 41 respectively, and several concave corners 43 formed by removing or eliminating predetermined portions of each respective corner of the heat sink ring 4. The base portion 41 defines a bottom wall 411, a top wall 412 opposite to the bottom wall 411, a receiving pace 410 extending therethrough along a mating direction for the optical cable subassembly 5 to pass through the base portion 41 to optically couple with the optical-electrical module, and a pair of cavities 4100 communication with the receiving space 410. A first post 44, a second post 45, and a third post 46 extending downwardly from the bottom wall 411 and spaced apart from each other. The first post 44 has a diameter smaller than a diameter of the second post 45. The diameter of the first post 44 is equal to the diameter of a diameter of the third post 46. These posts 44,45,46 are mated with the mounting holes 13,14,15 of the paddle card 1, respectively. The heat sink ring 4 substantially encloses the paddle card 1, and the walls of the heat sink ring 4 are made of metal or similar thermally conductive material for dissipating heat emitted by the opto-electronic communication device 2.

The optical cable subassembly 5 comprises a ferrule 51 optically coupling with the lens 32 of the lens array 3, an optical fiber 52 terminated with the ferrule 51, and a shell layer 53 enclosed the end of the optical fiber 52. The optical fiber 52 extends in a direction generally normal to the insertion direction of the ferrule 51.

The heat sink cover 6 comprises a main portion 61 including a top wall 611 having some holes 6111, a pair of opposite side walls 612 extending downwardly from the top wall 611. Both of the side walls 612 of the heat sink cover 6 comprise arms 613 extending downwardly, the arms 613 having a thickness smaller than a thickness of the sidewalls 612, the arms 613 inserted into the corresponding cavities of the heat sink ring 4. The heat sink cover 6 is made of metal or similar thermally conductive material for dissipating heat emitted by the opto-electronic communication device 2.

It is to be understood, however, that even though numerous characteristics and advanarmes of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. An active optical assembly comprising:
   a paddle card;
   an optical-electrical module including an opto-electronic communication device electrically connected with the paddle card, the opto-electronic communication device comprising a laser and a driver IC for converting electrical signal to optical signal, and a photodiode detector and a receiver IC for converting optical signal to electrical signal;
   a heat sink ring mounted to the paddle card;
   an optical cable subassembly inserted into the heat sink ring and optically coupling with the optical-electrical module; and
   a heat sink cover mounted to the heat sink ring, the heat sink cover cooperating with the heat sink ring and the paddle card to enclose the optical-electrical module so as to transfer heat generated by the opto-electronic communication device to the heat sink ring and the heat sink cover for dissipation.

2. The active optical assembly as recited in claim 1, further comprising a ceramic substrate bonded onto the paddle card, and wherein the opto-electronic communication device is bonded onto the ceramic substrate.

3. The active optical assembly as recited in claim 1, wherein the optical cable subassembly comprises a ferrule and an optical fiber terminated to the ferrule.

4. The active optical assembly as recited in claim 3, wherein the optical-electrical module comprises a lens array optically coupling with the ferrule.

5. The active optical assembly as recited in claim 1, wherein the heat sink ring comprises a base portion and a pair of beams extending upwardly from opposite ends of the base portion.

6. The active optical assembly as recited in claim 5, wherein the base portion of the heat sink ring defines a receiving space extending therethrough along a mating direction, and the optical cable subassembly passes through the receiving space to optically couple with the optical-electrical module.

7. The active optical assembly as recited in claim 6, wherein the heat sink cover comprises a top wall and a pair of opposite side walls extending downwardly from the top wall.

8. The active optical assembly as recited in claim 7, wherein the base portion of the heat sink ring has a pair of cavities in communication with the receiving space, each of the side walls of the heat sink cover comprises an arm extending downwardly, the arm having a thickness less than a thickness of the sidewall, and the arms are inserted into corresponding cavities.

9. The active optical assembly as recited in claim 6, wherein the heat sink ring comprises a first post and a second post extending downwardly from the base portion and spaced apart from each other, the first post having a diameter smaller than a diameter of the second post.

10. The active optical assembly as recited in claim 1, wherein the optical cable subassembly comprises a shell layer extending through the heat sink ring in a direction generally normal to the insertion direction of the ferrule.

11. An active optical assembly comprising:
    a paddle card;
    an optical-electrical module mounted upon the paddle card;
    a heat sink assembly defining therein a receiving cavity communicatively downwardly facing to the paddle card and into which said optical-electrical module is received; and
    an optical fiber subassembly extending into said receiving cavity;
    wherein
    said optical cable subassembly includes a plurality of optical fibers regulated by a ferrule within the receiving cavity and optically connected to the paddle card via a lens array within said receiving cavity.

12. The active optical assembly as claimed in claim 11, further including means for aligning the lens array with the paddle card and means for aligning the ferrule with the lens array in a vertical direction.

13. The active optical assembly as claimed in claim 11, wherein said heat sink assembly includes a pair of opposite channels to receive the ferrule therebetween.

14. The active optical assembly as claimed in claim 11, wherein said heat sink includes a lower heat sink ring and an upper heat sink cover stacked upon the lower heat sink ring with optical cable sandwiched therebetween.

15. The active optical assembly as claimed in claim 11, further including means for aligning the heat sink assembly with the paddle card in a vertical direction.

16. The active optical assembly as claimed in claim 11, wherein said optical-electrical module includes an IC mounted upon the paddle card upwardly facing toward the receiving cavity for heat transfer while heat accumulated in the paddle card is dispensed via interface between the heat sink assembly and the paddle card.

\* \* \* \* \*